(12) United States Patent
Anjum et al.

(10) Patent No.: US 11,495,549 B2
(45) Date of Patent: Nov. 8, 2022

(54) ELECTRONIC DEVICE WITH CRACK ARREST STRUCTURE

(71) Applicant: Texas Instruments Incorporated, Dallas, TX (US)

(72) Inventors: Naweed Anjum, Murphy, TX (US); Michael Gerald Amaro, Naperville, IL (US); Charles Allen Devries, Jr., Winfield, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/185,589

(22) Filed: Feb. 25, 2021

(65) Prior Publication Data
US 2022/0270984 A1 Aug. 25, 2022

(51) Int. Cl.
*H05K 1/18* (2006.01)
*H01L 23/00* (2006.01)
*H01L 23/495* (2006.01)

(52) U.S. Cl.
CPC ...... *H01L 23/562* (2013.01); *H01L 23/49503* (2013.01); *H01L 23/49534* (2013.01); *H01L 23/49541* (2013.01); *H05K 1/181* (2013.01); *H05K 2201/1003* (2013.01); *H05K 2201/10015* (2013.01)

(58) Field of Classification Search
CPC .................. H01L 23/562; H05K 1/181; H05K 2201/10015; H05K 2201/1003
USPC ....................................................... 174/260
See application file for complete search history.

(56) References Cited

U.S. PATENT DOCUMENTS

| 6,709,954 | B1* | 3/2004 | Werking | H01L 21/78 438/114 |
| 6,917,097 | B2* | 7/2005 | Chow | H01L 24/97 257/670 |
| 6,931,726 | B2 | 8/2005 | Boyko et al. | |
| 9,748,181 | B1* | 8/2017 | Jackson | H01L 23/3171 |
| 10,497,648 | B2 | 12/2019 | Fillion | |
| 10,692,737 | B2 | 6/2020 | Fillion et al. | |
| 2001/0010394 | A1* | 8/2001 | Hisano | H01L 23/49537 257/690 |
| 2002/0130400 | A1* | 9/2002 | Jeong | H01L 23/49548 257/E21.504 |
| 2004/0023562 | A1 | 2/2004 | Barry et al. | |
| 2004/0072472 | A1 | 4/2004 | Barry et al. | |
| 2010/0025824 | A1* | 2/2010 | Chen | H01L 23/585 257/E21.214 |

(Continued)

OTHER PUBLICATIONS

PCT Search Report Intl App No. PCT/US 2022/017802 dated Jun. 2, 2022, 2 pgs.

*Primary Examiner* — Sherman Ng
(74) *Attorney, Agent, or Firm* — Ronald O. Neerings; Charles A. Brill; Frank D. Cimino

(57) ABSTRACT

A packaged electronic device includes a multilayer lead frame with first and second trace levels, a via level, an insulator, a conductive landing pad and a conductive crack arrest structure, the conductive landing pad has a straight profile that extends along a first direction along a side of the multilayer lead frame, the conductive crack arrest structure has a straight profile along the first direction and the conductive crack arrest structure is spaced from the conductive landing pad along an orthogonal second direction.

20 Claims, 9 Drawing Sheets

(56) References Cited

U.S. PATENT DOCUMENTS

| | | | |
|---|---|---|---|
| 2010/0052106 A1* | 3/2010 | Lee | H01L 23/585 |
| | | | 257/E23.18 |
| 2012/0086112 A1 | 4/2012 | Amaro et al. | |
| 2015/0287670 A1* | 10/2015 | Fukase | H01L 23/562 |
| | | | 361/813 |
| 2017/0062313 A1* | 3/2017 | Miwatashi | H01L 24/03 |
| 2018/0090461 A1* | 3/2018 | Tanaka | H01L 23/5283 |
| 2020/0211760 A1 | 7/2020 | Brassfield et al. | |
| 2020/0313555 A1 | 10/2020 | Devries, Jr. et al. | |
| 2021/0305178 A1* | 9/2021 | West | H01L 23/60 |

* cited by examiner

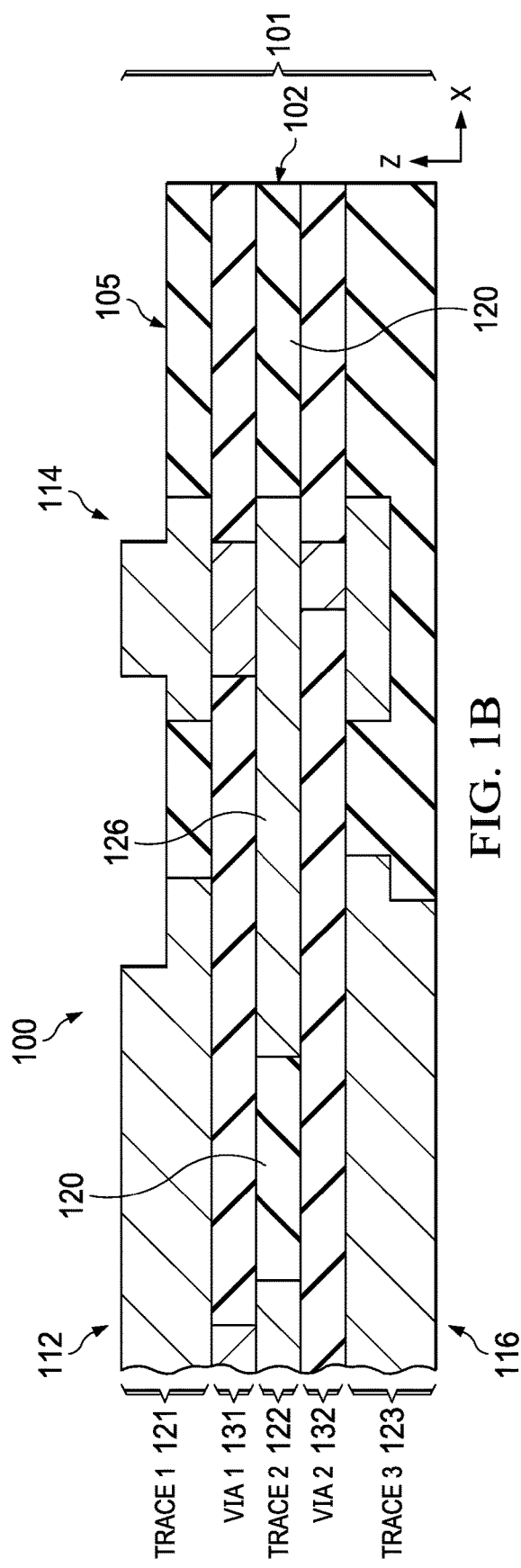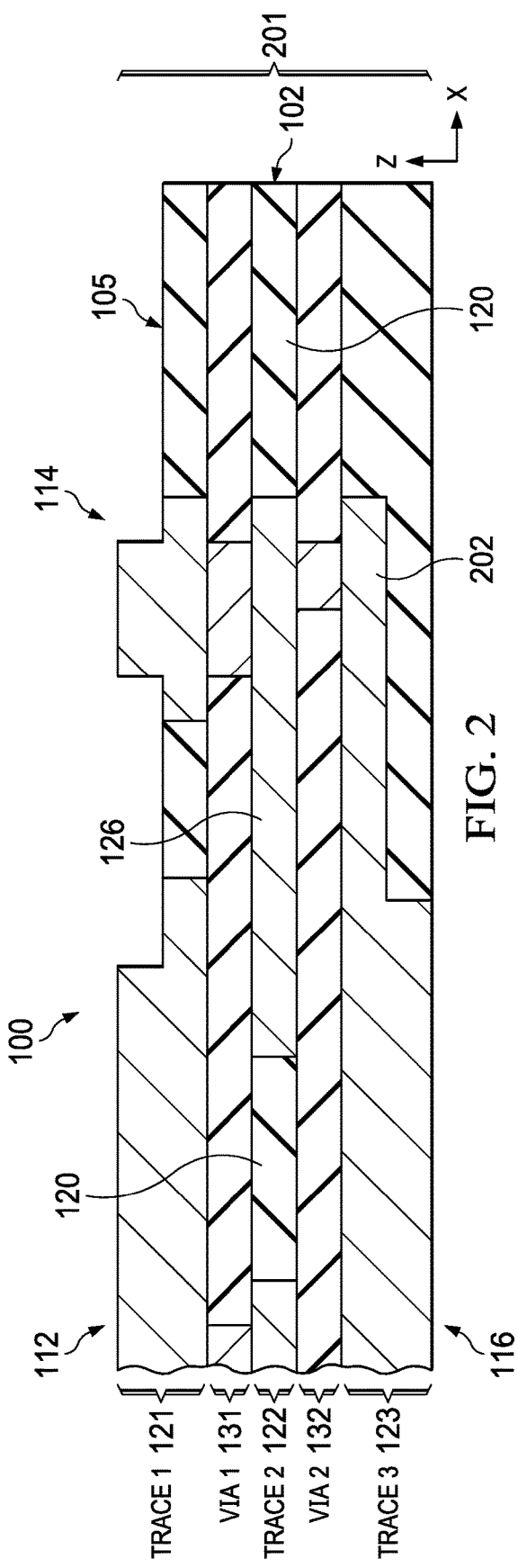

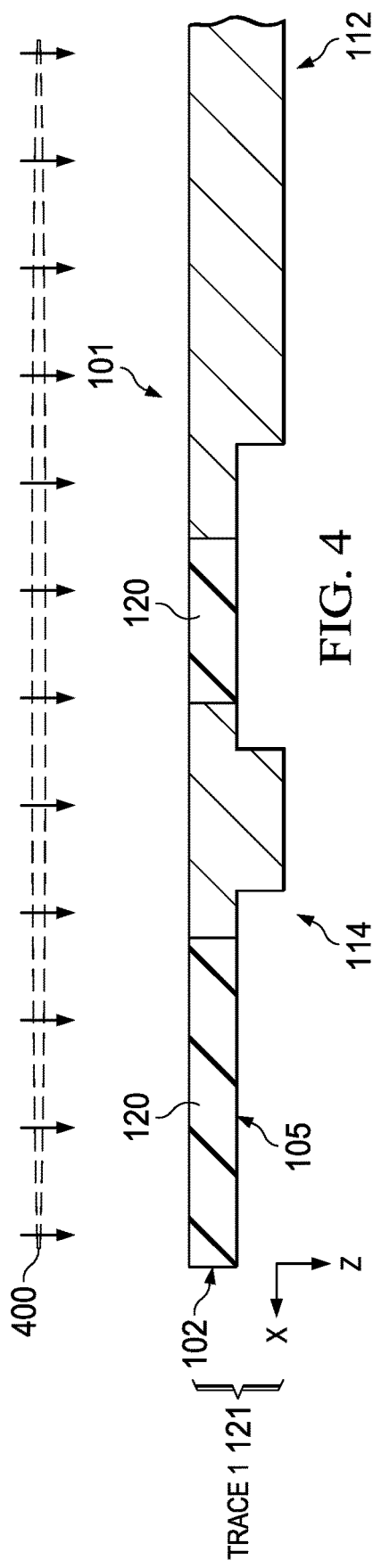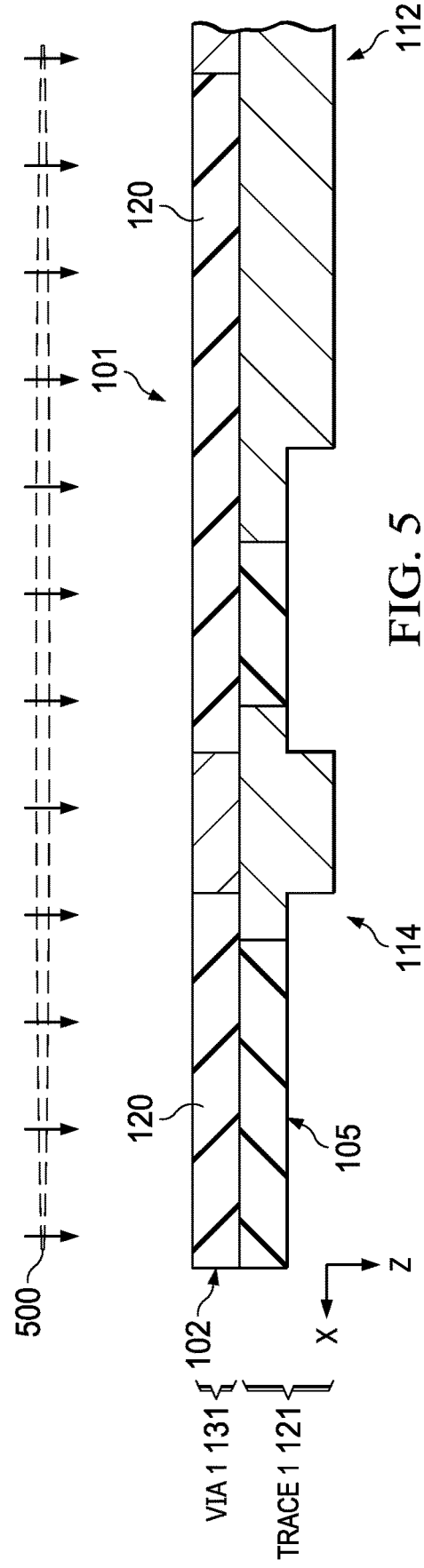

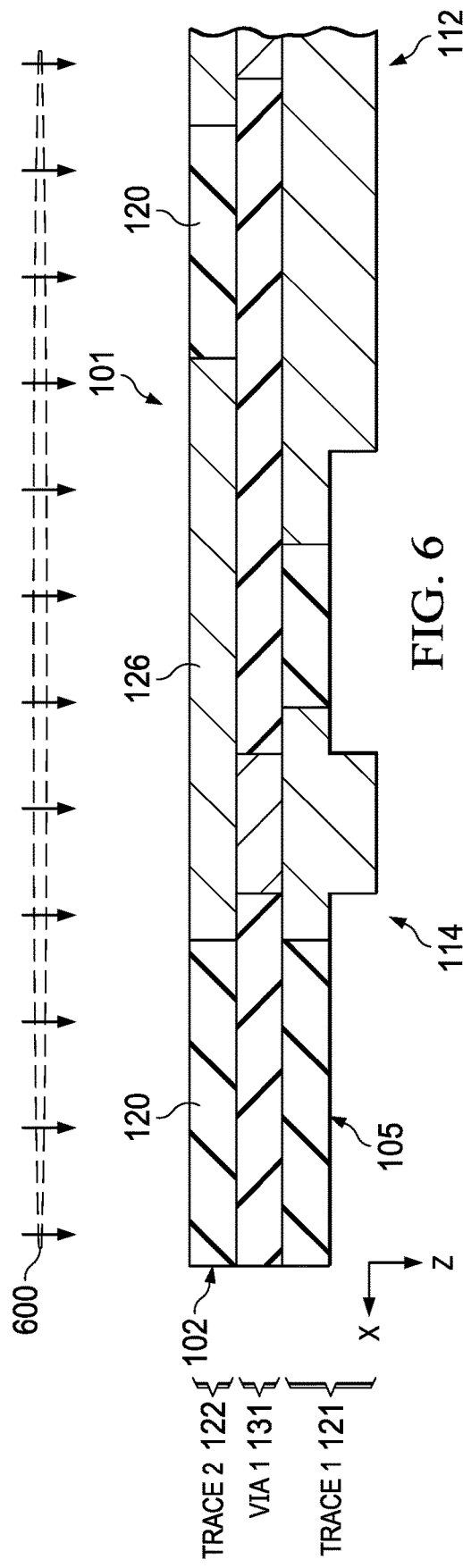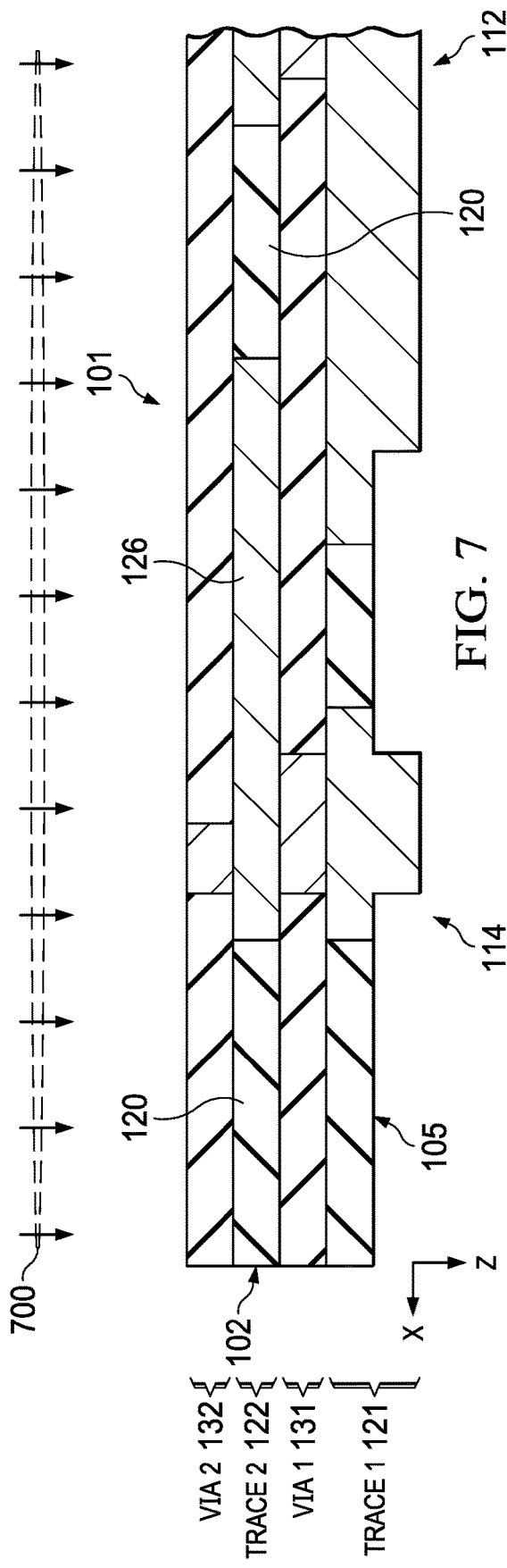

FIG. 10

ELECTRONIC DEVICE WITH CRACK ARREST STRUCTURE

BACKGROUND

Electronic products can include multiple components or chips mounted on a substrate and enclosed in a molded package that can be soldered to a host printed circuit board (PCB). Reliability testing after packaging can thermally stress the packaging, particularly where the constituent components and package structures have different coefficients of thermal expansion (CTEs). Structures expanding and contracting at different rates can cause cracks to form in a substrate material during reliability testing, possibly leading to solder extruding out of the package. Cracks can be mitigated by incorporating glass weave into a substrate to enhance reliability, but this is not feasible for thin substrates such as routable lead frame structures created using material layers such as Ajinomoto build-up film (ABF). Mold locks and weave patterns have not thus far adequately addressed cracking. Package sizes can be increased to increase molded wall rigidity, for example, to double wall thicknesses can be used, but this is contrary to continuing efforts to reduce electronic device size and cost.

SUMMARY

A packaged electronic device in one aspect includes a multilayer lead frame, an electronic component and a package structure. The multilayer lead frame has a first trace level, a second trace level, a via level, an insulator, a conductive landing pad and a conductive crack arrest structure. The first trace level includes first patterned conductive features, the second trace level includes second patterned conductive features, the via level includes conductive vias that interconnect respective ones of the first and second patterned conductive features, and the insulator extends between respective ones of the patterned conductive features of the first trace level, the second trace level and the via level. The conductive landing pad is disposed along a side of the multilayer lead frame and extends along a first direction. The electronic component is electrically coupled to the conductive landing pad the package structure encloses the electronic component and the conductive landing pad. The conductive landing pad has a first conductive landing pad portion in the first trace level, a second conductive landing pad portion in the second trace level and a conductive landing pad via in the via level. The conductive crack arrest structure has a straight profile along the first direction and is spaced from the conductive landing pad along an orthogonal second direction. The conductive crack arrest structure has a first conductive crack arrest structure portion in the first trace level, a second conductive crack arrest structure portion in the second trace level and a conductive crack arrest structure via in the via level.

In another aspect, a multilayer lead frame includes first and second trace levels, a via level between the first trace level and the second trace level, an insulator, a conductive landing pad and a conductive crack arrest structure. The first trace level has first patterned conductive features. The second trace level has second patterned conductive features. The via level includes conductive vias that interconnect respective ones of the first and second patterned conductive features. The insulator extends between respective ones of the patterned conductive features of the first trace level, the second trace level and the via level. The conductive landing pad is disposed along a side of the multilayer lead frame. The conductive landing pad has a first conductive landing pad portion in the first trace level, a second conductive landing pad portion in the second trace level and a conductive landing pad via in the via level, the conductive landing pad has a straight profile that extends along a first direction. The conductive crack arrest structure has a straight profile along the first direction, and the conductive crack arrest structure is spaced from the conductive landing pad along an orthogonal second direction. The conductive crack arrest structure has a first conductive crack arrest structure portion in the first trace level, a second conductive crack arrest structure portion in the second trace level and a conductive crack arrest via in the via level.

In another aspect, a method of fabricating a packaged electronic device includes forming a first trace level of a multilayer lead frame that has first patterned conductive features and an insulator portion between the first patterned conductive features, forming a via level of the multilayer lead frame that has conductive vias and another insulator portion between the conductive vias and forming a second trace level of the multilayer lead frame that has second patterned conductive features and a further insulator portion between the second patterned conductive features. The first patterned conductive features includes a first conductive landing pad portion disposed along a side of the multilayer lead frame and a first conductive crack arrest structure pad portion. The first conductive landing pad portion has a straight profile that extends along a first direction, and the first conductive crack arrest structure portion has a straight profile along the first direction. The first conductive crack arrest structure portion is spaced from the first conductive landing pad portion along a second direction, and the second direction being orthogonal to the first direction. The conductive vias include a conductive landing pad via that contacts the first conductive landing pad portion of the first trace level and a conductive crack arrest structure via that contacts the first conductive crack arrest structure portion of the first trace level. The second patterned conductive features include a second conductive landing pad portion that contacts the conductive landing pad via of the via level and a second conductive crack arrest structure portion that contacts the conductive crack arrest structure via of the via level.

BRIEF DESCRIPTION OF THE DRAWINGS

FIG. 1B is a partial sectional side elevation view of a portion of a crack arrest structure and a portion of a corresponding electronic component landing pad taken along line B-B in FIGS. 1 and 1A.

FIG. 2 is a partial sectional side elevation view of a portion of another crack arrest structure and a portion of a corresponding electronic component landing pad according to another embodiment.

Figure 10:
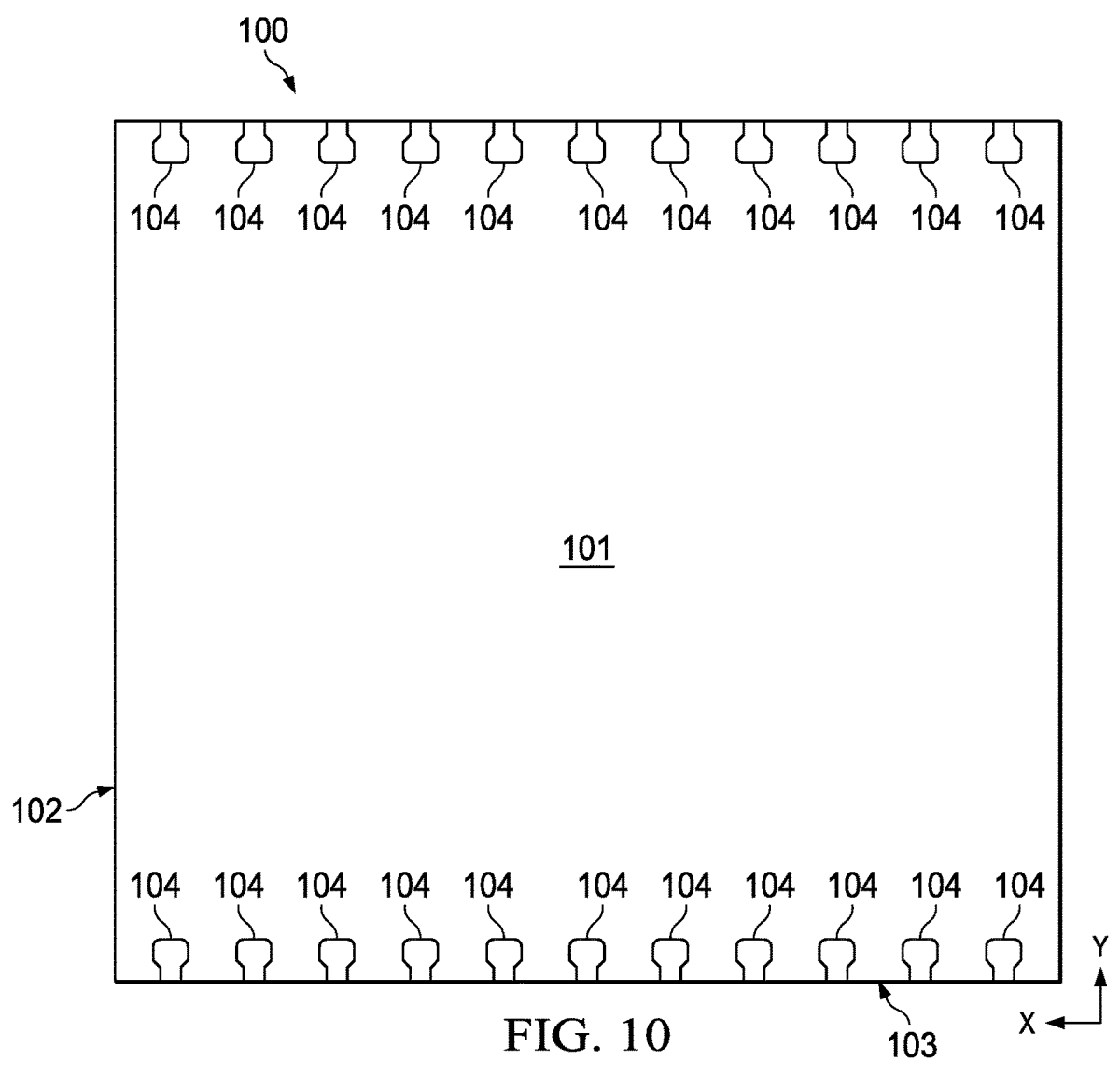

FIGS. 4-10 show the packaged electronic device of FIG. 1 undergoing fabrication processing according to the method of FIG. 3.

DETAILED DESCRIPTION

Figure 1:
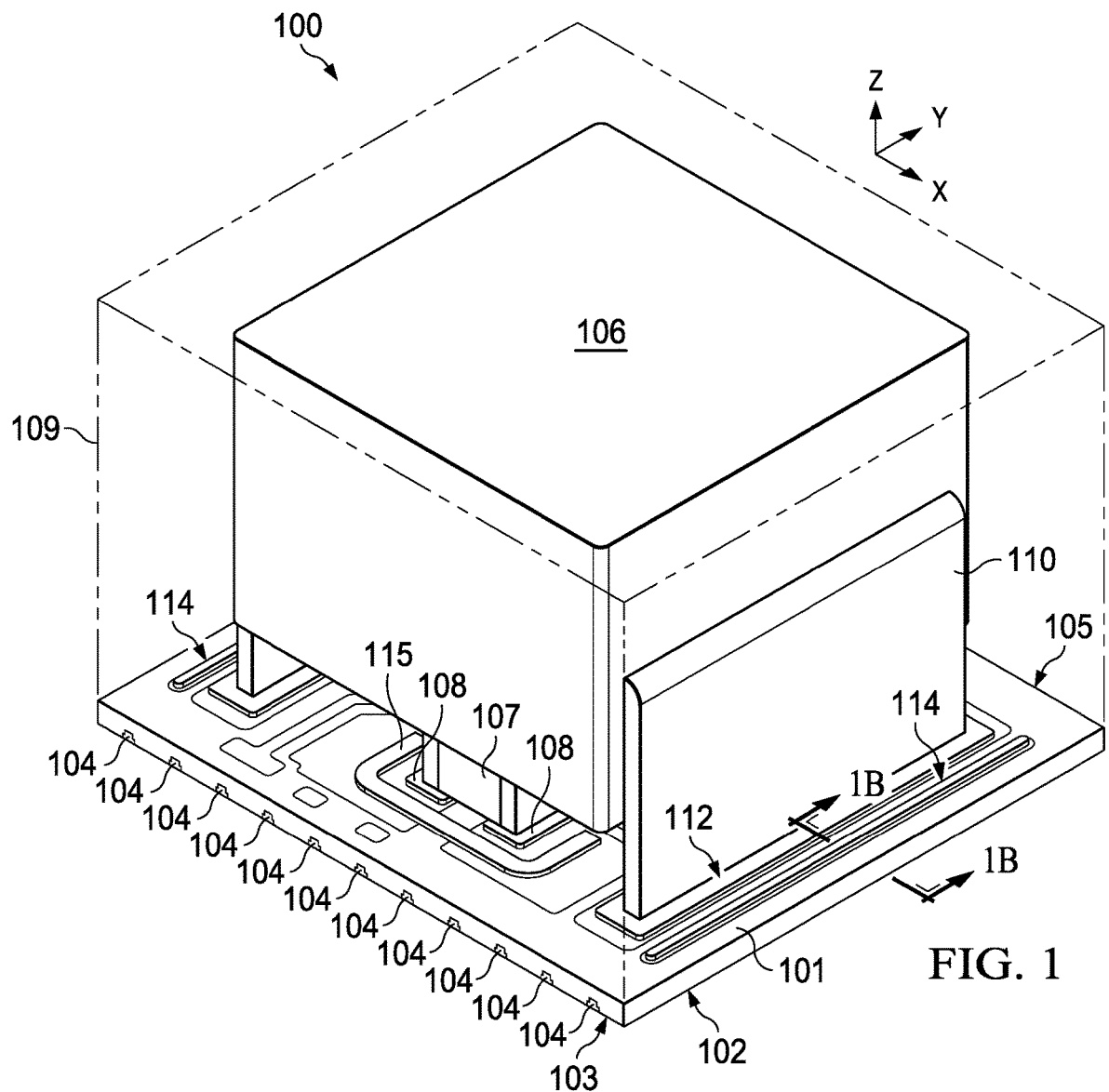
FIG. 1 is a perspective view of a packaged electronic device having a routable lead frame with crack arrest structures laterally spaced from respective electronic component landing pads.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Described examples provide crack arrest structures spaced from conductive landing pads in a multilayer lead frame to mitigate cracking in the multilayer lead frame and other structures of a packaged electronic device.

Figure 1A:
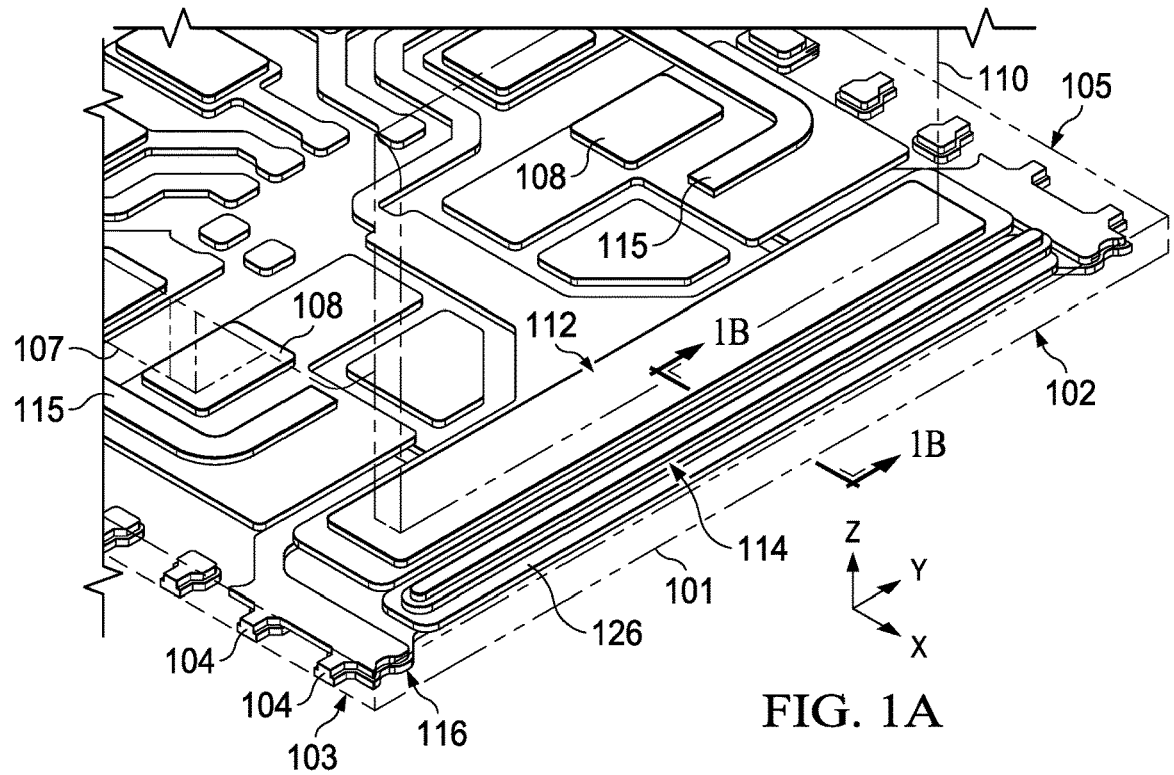
FIG. 1A is a partial perspective view of the packaged electronic device of FIG. 1.
Figure 1C:
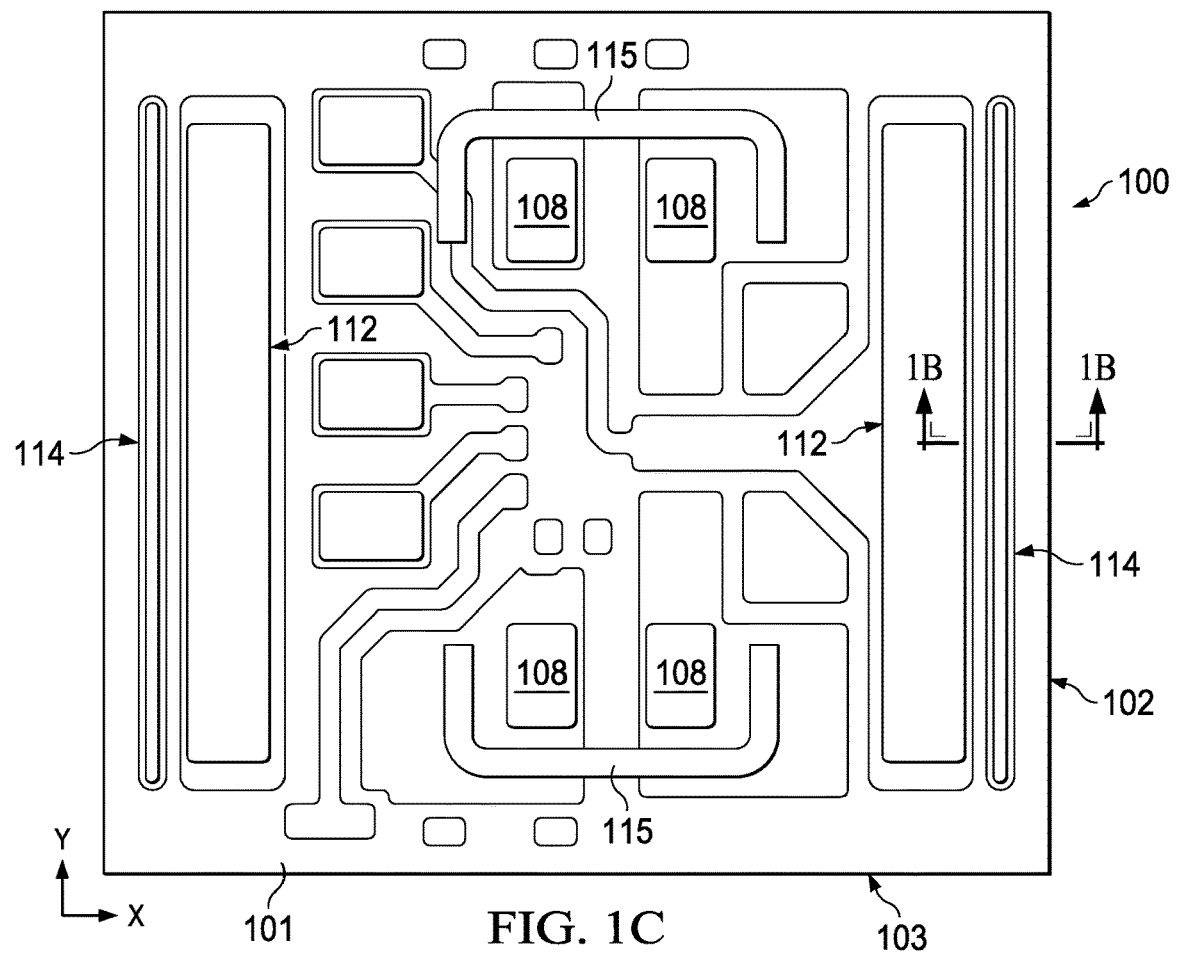
FIG. 1C is a top plan view of the routable lead frame in the packaged electronic device of FIG. 1.

FIGS. 1 and 1A-1C show a packaged electronic device 100 having a routable multilevel lead frame 101 with crack arrest structures laterally spaced from respective electronic component landing pad structures. FIG. 1A shows a partial perspective view of the packaged electronic device 100 near lateral ends 102 and 103 thereof. FIG. 1B shows a partial sectional side elevation view of a portion of the packaged electronic device 100 taken along line B-B in FIGS. 1 and 1A, and FIG. 1C shows a top plan view of the multilayer lead frame 101. The packaged electronic device 100 has conductive leads 104 exposed on the bottom and two opposite lateral sides. In practice, the leads 104 are soldered to corresponding conductive pads of a host PCB (not shown) to mechanically mount the packaged electronic device 100 and to form electrical connections between circuitry of the PCB and one or more circuits or components of the packaged electronic device 100. In another implementation, the packaged electronic device includes one or more conductive leads exposed in the interior of the bottom side, such as in a grid array type (e.g., LGA or BGA) package.

The multilayer lead frame 101 has a top side 105 with conductive landing pads exposed to allow soldering of electronic components to the multilayer lead frame 101 during fabrication. The illustrated example includes an inductor component 106, which can be a traqnsformer, and capacitor components 107. The multilayer lead frame 101 includes conductive landing pads 108 configured to allow soldering to end terminals of the respective capacitor components 107. A package structure 109 encloses the electronic components 106 and 107 and the top side 105 of the multilayer lead frame 101. The inductor component 106 includes terminals 110 soldered to corresponding conductive landing pads 112 exposed on the top side 105 of the multilayer lead frame 101. The multilayer lead frame 101 also has conductive crack arrest structures 114 and 115 that extend along one or more sides of the respective conductive landing pads 112 and 108. The multilayer lead frame 101 also includes conductive features such as a conductive pad 116 exposed along the bottom side of the multilayer lead frame 101, which can be soldered to a host PCB (not shown). The multilayer lead frame 101 further includes an insulator 120, such as multiple layers of Ajinomoto build-up film (ABF), for example 2-5 μm silica layers with epoxies.

As best shown in FIG. 1B, the example multilayer lead frame 101 has a first trace level 121, a second trace level 122 and a third trace level 123, along with first and second via levels in between. The illustrated conductive landing pad 112 and the corresponding conductive crack arrest structure 114 include conductive features of the first and second trace levels 121 and 122, and the crack arrest structure 114 includes a conductive feature of the third trace level 123. In addition, a second conductive crack arrest structure portion 126 in the second trace level 122 extends beneath (e.g., below) a portion of the conductive landing pad 112. The illustrated example has a first via level 131 and a second via level 132. The first trace level 121 includes first patterned conductive features, some of which are exposed along the top side 105 of the multilayer lead frame 101. The second trace level 122 has second patterned conductive features, including the second conductive crack arrest structure portion 126. The first via level 131 includes conductive vias that interconnect respective ones of the first and second patterned conductive features. The insulator 120 extends between respective ones of the patterned conductive features of the first trace level 121, the second trace level 122 and the via level 131. The third trace level 123 includes third patterned conductive features, and a further portion of the insulator extends between the third patterned conductive features. The second via level 132 has conductive vias that interconnect respective ones of the second and third patterned conductive features. The insulator 120 extends between respective ones of the patterned conductive features of the first trace level 121, the second trace level 122, the third trace level 123, and the vias of the first and second via levels 131 and 132.

The conductive landing pads 108 and 112 are disposed along the top side 105 of the multilayer lead frame 101. The individual conductive landing pads 108 and 112 in this example have a first conductive landing pad portion in the first trace level 121, a second conductive landing pad portion in the second trace level 122 and a conductive landing pad via in the via level 131. The conductive landing pad 112 has a longitudinal straight profile that extends along a first direction Y (e.g., into and out of the page in the sectional view of FIG. 1B). The first via level 131 extends between the first trace level 121 and the second trace level 122, and the conductive landing pad via connects the first conductive landing pad portion to the second conductive landing pad portion.

The conductive crack arrest structures 114 and 115 have a straight profile along the first direction Y, generally parallel to the longitudinal extent of the corresponding conductive landing pads 112 and 108. The individual conductive crack arrest structures 114 and 115 are formed by the interconnection of several conductive structures including a first conductive crack arrest structure portion in the first trace level 121, a second conductive crack arrest structure portion 126 in the second trace level 122, a first conductive crack arrest via in the first via level 131, a third conductive crack arrest structure portion in the third trace level 122 and a second conductive crack arrest via in the second via level 132. The first conductive crack arrest via connects the first conductive crack arrest structure portion to the second conductive crack arrest structure portion 126, and the second conductive crack arrest via connects the third conductive crack arrest structure portion to the second conductive crack arrest structure portion 126.

The conductive crack arrest structures 114 and 115 are spaced from the respective conductive landing pads 112 and 108 along a second direction X that is orthogonal to the first direction Y, with only the insulator portions therebetween.

This arrangement provides a migration barrier to localize any cracking that occurs within the material of the intervening insulator 120. In the illustrated example, the multilayer lead frame 101 and the individual levels 121, 131, 122, 132 and 123 thereof are generally planar and parallel to an X-Y plane in the illustrated orientation. The multilayer lead frame 101 is formed as a stacked arrangement with the levels 121, 131, 122, 132 and 123 of the extending successively downward along a vertical third direction Z. In the illustrated example, the second conductive crack arrest structure portion 126 of the conductive crack arrest structure 114 extends under the first conductive landing pad portion of the conductive landing pad 112 to further mitigate crack extension. In this regard, cracks are less likely to follow a curved path through the insulator 120 around the underlying extension of the second conductive crack arrest structure portion 126.

As further shown in FIGS. 1, 1A and 1C, the individual conductive crack arrest structures 115 extend laterally around all or at least portions of two orthogonal sides of the respective capacitor conductive landing pads 108. The conductive crack arrest structures 115 in this example have three portions, each spaced laterally from and extending generally parallel to a corresponding straight side of the associated conductive landing pads 108. In another example, a conductive crack arrest structure completely laterally encircles the associated conductive landing pad. In a further example, the multilayer lead frame includes a conductive crack arrest structure laterally spaced from and between two different conductive landing pads.

FIG. 2 shows a portion of another multilayer lead frame 201 having a conductive crack arrest structure 114 and a portion of a corresponding electronic component conductive landing pad 112 according to another embodiment. The conductive landing pad 112 and the conductive crack arrest structure example 114 in this example are generally as described above. In this example, however, the conductive crack arrest structure 114 has a third conductive crack arrest structure portion 202 that is connected to the conductive pad 116 exposed on the bottom (second) side of the multilayer lead frame 201. This example encloses the insulator portions 120 that extend between the conductive landing pad 112 and the conductive crack arrest structure 114 with conductive material to mitigate crack migration. In addition, the second conductive crack arrest structure portion 126 extends under the first conductive landing pad portion of the conductive landing pad 112.

Referring now to FIGS. 3-10, FIG. 3 shows a method 300 of fabricating a packaged electronic device according to another embodiment. The method 300 is described below in connection with fabrication of the example packaged electronic device 100 of FIGS. 1, 1A, 1B and 1C. FIGS. 4-10 show the packaged electronic device 100 undergoing fabrication processing according to the method 300 of FIG. 3. The method 300 includes fabrication of the multilayer lead frame 101 at 302. In one implementation, the lead frame 101 is fabricated at 302 one level at a time, beginning with fabrication of a starting core level, followed by fabrication of additional levels using copper or other conductive metal and insulator material, such as one or more ABF layers. The lead frame fabrication 302 is described below as beginning with the first trace layer 121 at 303 and proceeding with the sequential formation of the first via level 131, the second trace level 122, the second via level 132 and then the third trace level 123. In other implementations, different sequences can be used, for example, starting with an interior level and fabricating additional levels on either side of the starting (e.g., core) level. In the illustrated example, certain trace levels include patterned conductive features with steps having features of different thicknesses (e.g., stepped copper features or traces of the first and third trace levels 121 and 123 as seen in FIGS. 1B and 2 above).

At 303, a patterned first trace layer and insulator portion of the first trace level 121 are formed. FIG. 4 shows the example first trace level 121 undergoing a single level fabrication process 400 that forms the first patterned conductive features of the conductive landing pad 112 and the conductive crack arrest structure 114, as well as the associated insulator portion 120 between the first patterned conductive features. The first patterned conductive features include a first conductive landing pad portion disposed along the illustrated bottom side of the multilayer lead frame 101 and a first conductive crack arrest structure pad portion. The first conductive landing pad portion and the first conductive crack arrest structure portion have straight profile that extend along the first direction (e.g., Y into and out of the page in FIG. 4). The first conductive crack arrest structure portion is spaced from the first conductive landing pad portion along the second direction X as shown in FIG. 4. In one implementation, the single level process 400 uses Ajinomoto build-up film insulator layers of the insulator structure 120 that are adhered to the patterned conductive features by vacuum lamination, followed by thermal pre-curing and desired laser via formation and smear removal in the ABF laminate layer. A thin copper layer is plated on the ABF layer following optional deposition of a copper seed layer, and a photo resist layer is formed and patterned on the deposited copper to facilitate formation of stepped copper structures in the fabricated trace level 121. Thereafter, further copper deposition is performed, for example, using copper electroplating, and the patterned resist layer is then removed. The thin copper is then optionally etched, followed by full curing, for example, at 180 to 200 degrees C. Similar processing is used in one example for the subsequent fabrication of the remaining levels 131, 122, 132 and 123 of the example multilayer lead frame 101 in the lead frame fabrication at 302.

At 304, a patterned first via layer and insulator portion of the first via level 131 are formed on the finished side of the first trace level 121. FIG. 5 shows the example first via level 131 undergoing a single level fabrication process 500 that forms the first conductive vias of the conductive landing pad 112 and the conductive crack arrest structure 114, as well as the associated further insulator portion 120 between the first patterned conductive vias. The first via level 131 in this example has a conductive landing pad via that contacts the first conductive landing pad portion of the first trace level 121, as well as a conductive crack arrest structure via that contacts the first conductive crack arrest structure portion of the first trace level 121.

Figure 3:
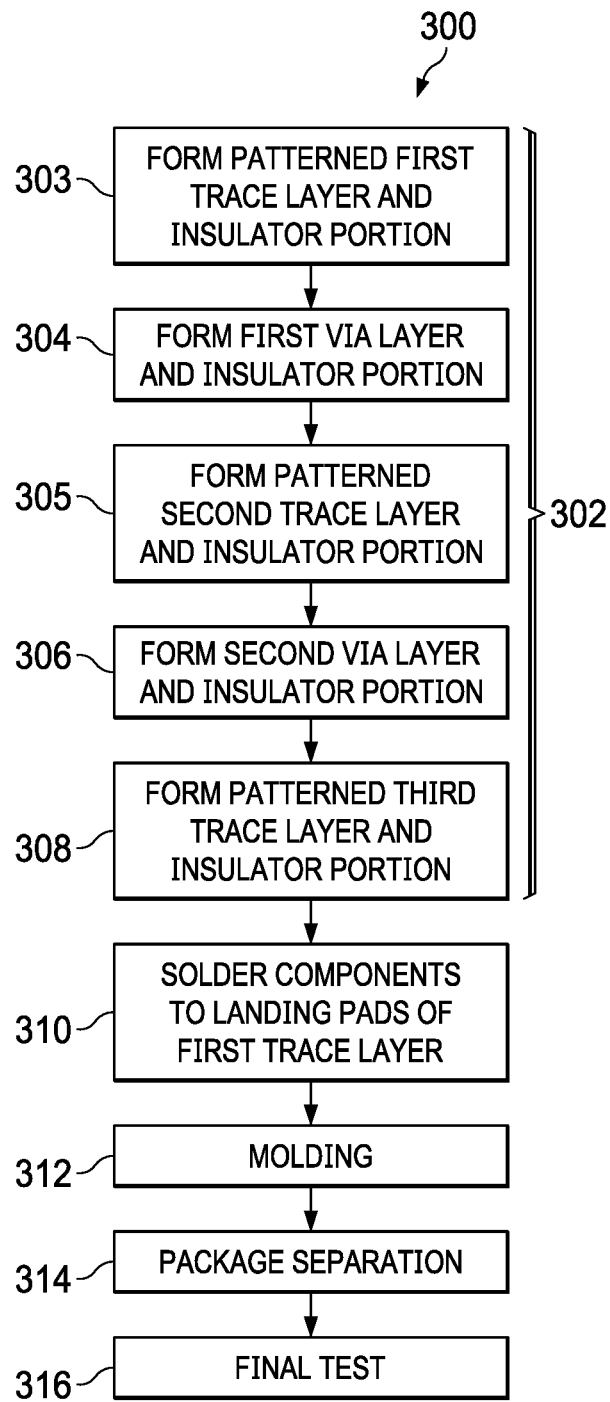
FIG. 3 is a flow diagram of a method of fabricating a packaged electronic device according to another embodiment.

At 305 in FIG. 3, a patterned second trace layer and insulator portion of the second trace level 122 are formed. FIG. 6 shows the example first trace level 121 undergoing a single level fabrication process 600 that forms the second patterned conductive features of the conductive landing pad 112 and the conductive crack arrest structure 114, as well as the associated insulator portion 120 between the second patterned conductive features. The second patterned conductive features include the second conductive landing pad portion that contacts the conductive landing pad via of the via level 131. The second patterned conductive features also include the second conductive crack arrest structure portion 126 that contacts the conductive crack arrest structure via of the via level 131 and extends laterally under the first conductive landing pad portion (above in the orientation of FIG. 6).

At 306, the patterned second via layer and insulator portion of the second via level 132 are formed on the finished side of the second trace level 122. FIG. 7 shows the example second via level 132 undergoing another single level fabrication process 700 that forms the second conductive vias of the conductive landing pad 112 and the conductive crack arrest structure 114, as well as the associated further insulator portion 120 between the second patterned conductive vias. The conductive second vias include the second conductive crack arrest via that contacts the second conductive crack arrest structure portion 126.

Figure 8:
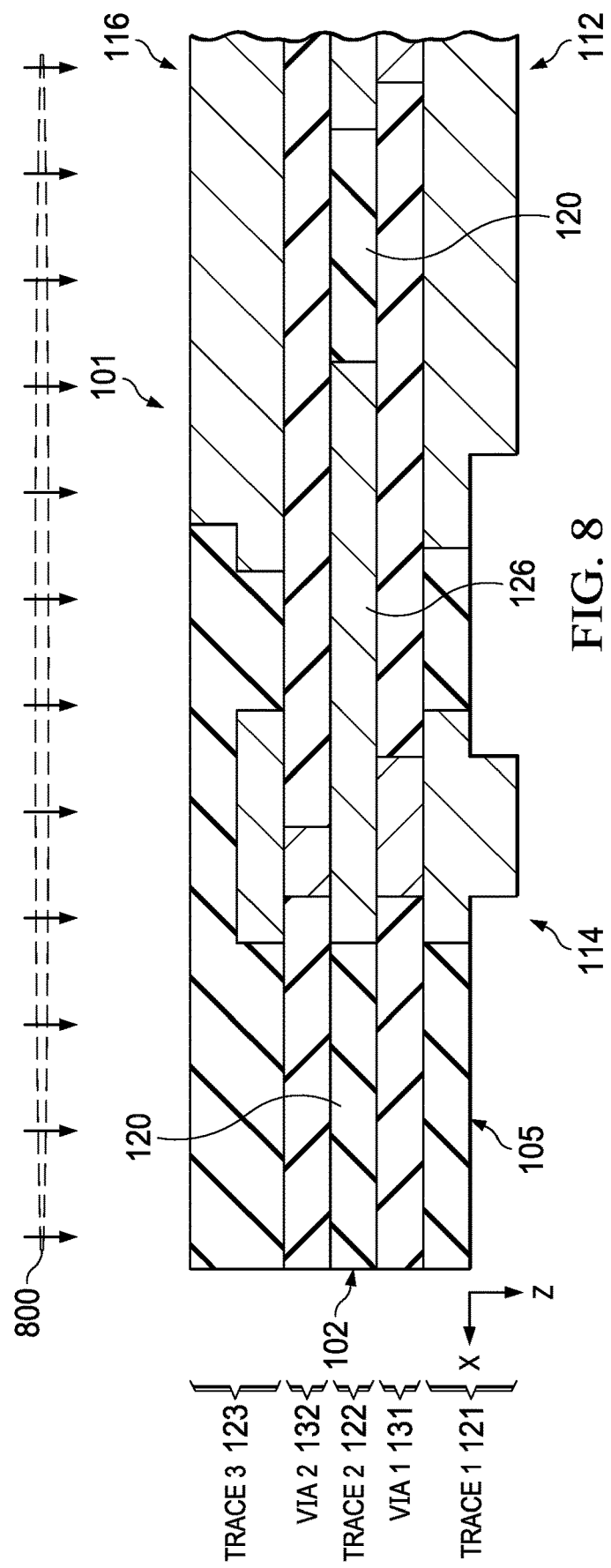

At 308, a patterned third trace layer and insulator portion of the third trace level 123 are formed. FIG. 8 shows the example third trace level 123 undergoing a single level fabrication process 800 that forms the third patterned conductive features of the conductive crack arrest structure 114, as well as the associated insulator portion 120 between the third patterned conductive features and the conductive pad 116 exposed along the bottom side of the multilayer lead frame 101 (shown on top in the orientation of FIG. 10). The third patterned conductive features including the third conductive crack arrest structure portion that contacts the second conductive crack arrest structure via of the second via level 132. In another implementation, the conductive crack arrest structure 114 has a third conductive crack arrest structure portion 202 that is connected to the conductive pad 116 exposed on the bottom (second) side of the multilayer lead frame 201 as shown above in FIG. 2.

Figure 9:
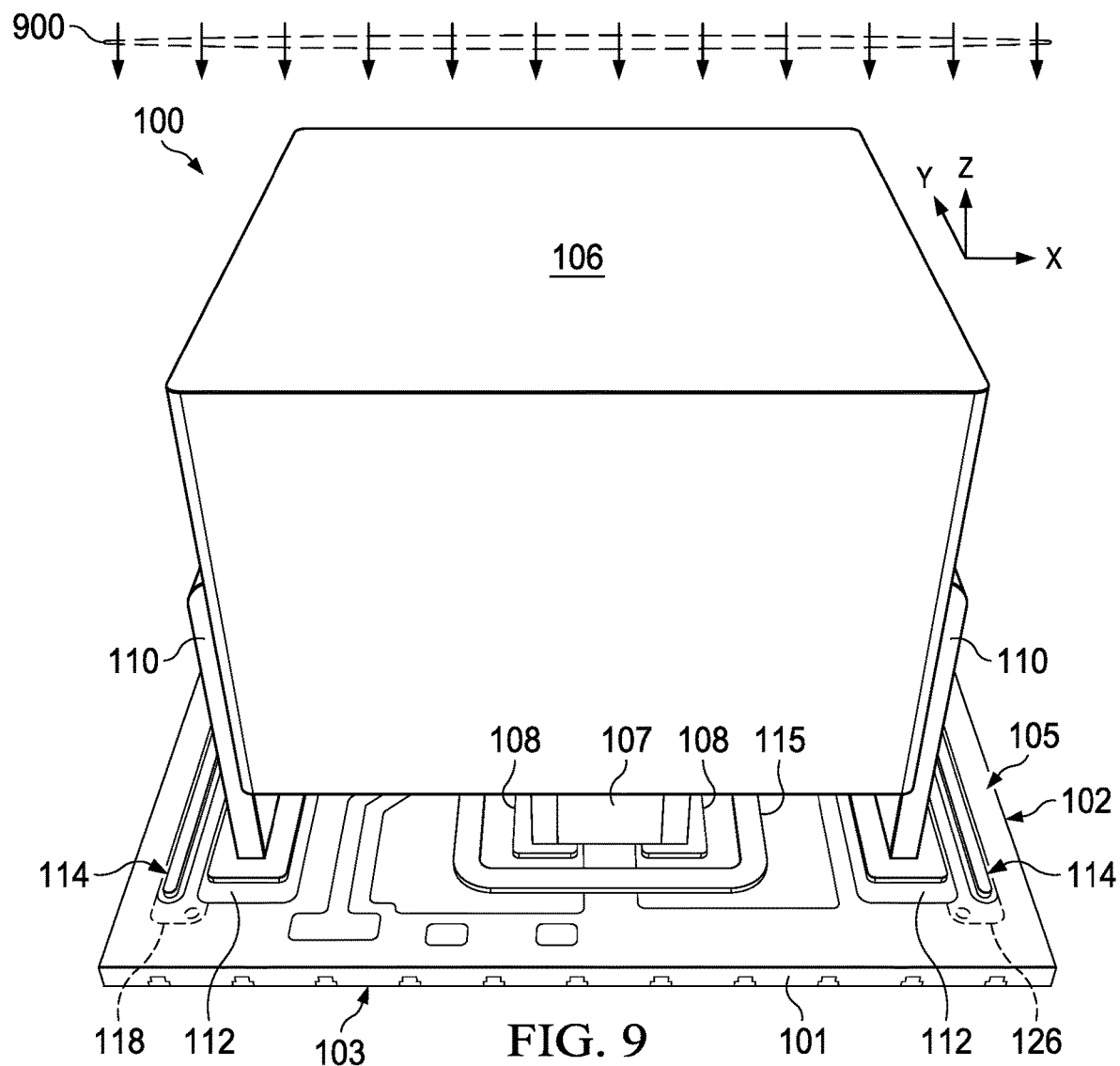

Following the fabrication of the multilayer lead frame 101 at 302, the method 300 continues in FIG. 3 with soldering 310 one or more electronic components to associated first conductive landing pad portions on the tope side 105 of the multilayer lead frame 101. FIG. 9 shows the electronic device 100 undergoing a component attachment process 900 that provides solder paste to select areas of the top side 105 of the multilayer lead frame 101 including all or portions of the exposed upper sides of the conductive landing pads 108 and 112, followed by automated pick and place operations to place the capacitors on two associated conductive landing pads 108 and to place the terminals 110 of the inductor component 106 on associated conductive landing pads 112. The solder paste is then thermally reflowed to create solder connections between the component terminals and the sop sides of the conductive landing pads 108, 112.

At 312, the upper portions of the electronic device 100 are molded using a molding compound to form the package structure 109 that encloses the electronic components 106, 110 and 107 and encloses the first conductive landing pad portions as shown in FIG. 1 above. The illustrated method 300 also includes optional package separation at 314, for example, orthogonal package sawing operations to separate individual finished electronic devices from a starting panel lead frame structure, and the method concludes with final device testing at 316.

The presence of the conductive crack arrest structures 108 and 114 improves product reliability by mitigating adverse effects of CTE differences in structural components during thermal processing, including thermal operations during fabrication after component soldering by controlling or reducing the extent of cracking without increasing the amount of solder used or increasing device size and cost. The conductive crack arrest structures 108 and 114 in the multilayer lead frames 101, 201 operate in similar fashion to how re-bar strengthens concrete and serves to enhance the strength of the materials to resist stress cracks. In the illustrated device 100, the large inductor component 106 can expand faster than adjacent structures during thermal processing and press on the molding wall, which creates stress at the substrate or multilayer lead frame 101, 201. The conductive crack arrest structures 108 and 114 increase robustness of the electronic device package without adverse impacts to body size or increase in cost, while making the multilevel lead frame 101, 201 stronger and less brittle to mitigate cracking and escape of solder and block any possible crack propagation. This provides higher production yield while retaining the original product power density advantages of low profile routable multilayer lead frames and stilted inductor technology while improving the robustness of solutions that meet or exceed reliability standards for use of integrated electronic products in adverse environments, such as industrial and automotive applications.

Modifications are possible in the described examples, and other implementations are possible, within the scope of the claims.

What is claimed is:

1. A packaged electronic device, comprising:
a multilayer lead frame having a first trace level, a second trace level, a via level, an insulator, a conductive landing pad and a conductive crack arrest structure, the first trace level including first patterned conductive features, the second trace level including second patterned conductive features, the via level including conductive vias that interconnect respective ones of the first and second patterned conductive features, the insulator extending between respective ones of the patterned conductive features and vias of the first trace level, the second trace level and the via level, and the conductive landing pad disposed along a side of the multilayer lead frame;
an electronic component electrically coupled to the conductive landing pad; and
a package structure that encloses the electronic component and the conductive landing pad;
the conductive landing pad having a straight profile that extends along a first direction, the conductive landing pad having a first conductive landing pad portion in the first trace level, a second conductive landing pad portion in the second trace level and a conductive landing pad via in the via level;
the conductive crack arrest structure having a straight profile along the first direction, the conductive crack arrest structure having a first conductive crack arrest structure portion in the first trace level, a second conductive crack arrest structure portion in the second trace level and a conductive crack arrest structure via in the via level, and the conductive crack arrest structure spaced from the conductive landing pad along a second direction, the second direction being orthogonal to the first direction.

2. The packaged electronic device of claim 1, wherein the second conductive crack arrest structure portion of the conductive crack arrest structure extends under the first conductive landing pad portion of the conductive landing pad.

3. The packaged electronic device of claim 2, wherein:
the multilayer lead frame includes a third trace level and a second via level, the conductive crack arrest structure having a third conductive crack arrest structure portion in the third trace level and a second conductive crack arrest via in the second via level; and the second conductive crack arrest via connects the third conductive crack arrest structure portion to the second conductive crack arrest structure portion.

4. The packaged electronic device of claim 3, wherein the third conductive crack arrest structure portion is connected to a pad exposed on a second side of the multilayer lead frame.

5. The packaged electronic device of claim 4, wherein the second conductive crack arrest structure portion extends under the first conductive landing pad portion of the conductive landing pad.

6. The packaged electronic device of claim 5, wherein the conductive crack arrest structure extends around two orthogonal sides of the conductive landing pad.

7. The packaged electronic device of claim 3, wherein the conductive crack arrest structure extends around two orthogonal sides of the conductive landing pad.

8. The packaged electronic device of claim 2, wherein the conductive crack arrest structure extends around two orthogonal sides of the conductive landing pad.

9. The packaged electronic device of claim 1, wherein the conductive crack arrest structure extends around two orthogonal sides of the conductive landing pad.

10. The packaged electronic device of claim 9, wherein:
the multilayer lead frame includes a third trace level and a second via level, the conductive crack arrest structure having a third conductive crack arrest structure portion in the third trace level and a second conductive crack arrest via in the second via level; and
the second conductive crack arrest via connects the third conductive crack arrest structure portion to the second conductive crack arrest structure portion.

11. A multilayer lead frame, comprising:
a first trace level having first patterned conductive features;
a second trace level having second patterned conductive features;
a via level between the first trace level and the second trace level, the via level including conductive vias that interconnect respective ones of the first and second patterned conductive features;
an insulator extending between respective ones of the patterned conductive features and vias of the first trace level, the second trace level and the via level;
a conductive landing pad disposed along a side of the multilayer lead frame, the conductive landing pad having a first conductive landing pad portion in the first trace level, a second conductive landing pad portion in the second trace level and a conductive landing pad via in the via level, the conductive landing pad having a straight profile that extends along a first direction; and
a conductive crack arrest structure having a straight profile along the first direction, the conductive crack arrest structure having a first conductive crack arrest structure portion in the first trace level, a second conductive crack arrest structure portion in the second trace level and a conductive crack arrest via in the via level, and the conductive crack arrest structure spaced from the conductive landing pad along a second direction, the second direction being orthogonal to the first direction.

12. The multilayer lead frame of claim 11, wherein the second conductive crack arrest structure portion of the conductive crack arrest structure extends under the first conductive landing pad portion of the conductive landing pad.

13. The multilayer lead frame of claim 12, wherein:
the multilayer lead frame includes a third trace level and a second via level, the conductive crack arrest structure having a third conductive crack arrest structure portion in the third trace level and a second conductive crack arrest via in the second via level; and
the second conductive crack arrest via connects the third conductive crack arrest structure portion to the second conductive crack arrest structure portion.

14. The multilayer lead frame of claim 13, wherein the third conductive crack arrest structure portion is connected to a pad exposed on a second side of the multilayer lead frame.

15. The multilayer lead frame of claim 14, wherein the second conductive crack arrest structure portion extends under the first conductive landing pad portion of the conductive landing pad.

16. The multilayer lead frame of claim 11, wherein the conductive crack arrest structure extends around two orthogonal sides of the conductive landing pad.

17. The multilayer lead frame of claim 16, wherein:
the multilayer lead frame includes a third trace level and a second via level, the conductive crack arrest structure having a third conductive crack arrest structure portion in the third trace level and a second conductive crack arrest via in the second via level; and
the second conductive crack arrest via connects the third conductive crack arrest structure portion to the second conductive crack arrest structure portion.

18. A method of fabricating a packaged electronic device, the method comprising:
forming a first trace level of a multilayer lead frame, the first trace level having first patterned conductive features and an insulator portion between the first patterned conductive features, the first patterned conductive features including a first conductive landing pad portion disposed along a side of the multilayer lead frame and a first conductive crack arrest structure pad portion, the first conductive landing pad portion having a straight profile that extends along a first direction, the first conductive crack arrest structure portion having a straight profile along the first direction, the first conductive crack arrest structure portion spaced from the first conductive landing pad portion along a second direction, and the second direction being orthogonal to the first direction;
forming a via level of the multilayer lead frame, the via level having conductive vias and another insulator portion between the conductive vias, the conductive vias including a conductive landing pad via that contacts the first conductive landing pad portion of the first trace level and a conductive crack arrest structure via that contacts the first conductive crack arrest structure portion of the first trace level; and
forming a second trace level of the multilayer lead frame, the second trace level having second patterned conductive features and a further insulator portion between the second patterned conductive features, the second patterned conductive features including a second conductive landing pad portion that contacts the conductive landing pad via of the via level and a second conductive crack arrest structure portion that contacts the conductive crack arrest structure via of the via level.

19. The method of claim 18, further comprising:
soldering an electronic component to the first conductive landing pad portion; and
forming a package structure that encloses the electronic component and the first conductive landing pad portion.

20. The method of claim 18, further comprising:
forming a second via level of the multilayer lead frame, the second via level having conductive second vias and yet another insulator portion between the conductive second vias, the conductive second vias including a second conductive crack arrest via that contacts the second conductive crack arrest structure portion; and
forming a third trace level of the multilayer lead frame, the third trace level having third patterned conductive features and an additional insulator portion between the third patterned conductive features, the third patterned conductive features including a third conductive crack arrest structure portion that contacts the second conductive crack arrest structure via of the second via level.

* * * * *